United States Patent
Kimpel et al.

(10) Patent No.: US 10,645,833 B2
(45) Date of Patent: May 5, 2020

(54) MULTI-PART DEVICE AND METHOD FOR MANUFACTURING THIS MULTI-PART DEVICE

(71) Applicant: Robert Bosch GmbH, Stuttgart (DE)

(72) Inventors: Thomas Kimpel, Moessingen (DE); Christian Rother, Reutlingen (DE); Gerhard Schalowski, Dettingen (DE); Hack-Min Kim, Boeblingen (DE); Raphael Segiet, Reutlingen (DE); Walter Wagner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 59 days.

(21) Appl. No.: 15/737,385

(22) PCT Filed: Jun. 20, 2016

(86) PCT No.: PCT/EP2016/064121
§ 371 (c)(1),
(2) Date: Dec. 18, 2017

(87) PCT Pub. No.: WO2017/005476
PCT Pub. Date: Jan. 12, 2017

(65) Prior Publication Data
US 2018/0184536 A1    Jun. 28, 2018

(30) Foreign Application Priority Data
Jul. 7, 2015 (DE) .......... 10 2015 212 680

(51) Int. Cl.
B32B 3/10 (2006.01)
H05K 5/06 (2006.01)
(Continued)

(52) U.S. Cl.
CPC .......... *H05K 5/069* (2013.01); *C09J 5/00* (2013.01); *H05K 5/0004* (2013.01); *H05K 5/062* (2013.01)

(58) Field of Classification Search
None
See application file for complete search history.

(56) References Cited

U.S. PATENT DOCUMENTS

2014/0166331 A1   6/2014  Godwin et al.
2015/0145386 A1   5/2015  Chang

FOREIGN PATENT DOCUMENTS

CN    1043803 A    7/1990
CN    1486391 A    3/2004
(Continued)

OTHER PUBLICATIONS

Machine Translation of JP2000303617 (Year: 2000).*
(Continued)

*Primary Examiner* — Christopher M Polley
(74) *Attorney, Agent, or Firm* — Norton Rose Fulbright US LLP; Gerard Messina (57) ABSTRACT

A device includes a joining partner, which protrudes at a submersion depth into a recess filled at least partially with a fixing element in a substrate surface of a substrate. A compensating element is situated between the joining partner and the fixing element. The compensating element is situated at least partially in the fixing element within the submersion depth of the joining partner. Accordingly, the compensating element is in contact with the joining partner and with the fixing element. In this way, an expansion change or a movement of the fixing element, of the substrate or of the joining partner may be compensated for by a compression or elongation of the compensating element. A (Continued)

crack formation may be avoided or its effect may be minimized by the sealing function.

5 Claims, 8 Drawing Sheets

(51) Int. Cl.
    *C09J 5/00*     (2006.01)
    *H05K 5/00*     (2006.01)

(56) References Cited

FOREIGN PATENT DOCUMENTS

| CN | 1575115 | A | | 2/2005 |
|---|---|---|---|---|
| CN | 101346571 | A | | 1/2009 |
| CN | 102511120 | A | | 6/2012 |
| DE | 4340108 | C2 | | 9/1997 |
| DE | 29819434 | U1 | | 2/1999 |
| DE | 10333967 | A1 | | 2/2005 |
| DE | 102011088037 | A1 | | 6/2013 |
| EP | 1501341 | A2 | | 1/2005 |
| JP | H0739043 | A | | 2/1995 |
| JP | H07158624 | A | | 6/1995 |
| JP | 2000303617 | A | * | 10/2000 |
| JP | 4003344 | B2 | | 11/2007 |
| JP | 2010080768 | A | | 4/2010 |
| JP | 2011086817 | A | | 4/2011 |

OTHER PUBLICATIONS

International Search Report dated Sep. 21, 2016, of the corresponding International Application PCT/EP2016/064121 filed Jun. 20, 2016.

* cited by examiner

MULTI-PART DEVICE AND METHOD FOR MANUFACTURING THIS MULTI-PART DEVICE

BACKGROUND INFORMATION

The present invention relates to a fixing of one joining partner on a substrate using a fixing element and a compensating element in order, for example, to avoid crack formations in the fixing element resulting from alternating thermal expansion changes and in order to implement an optimized sealing function, as well as a method for manufacturing this fixing.

Electronic components may be damaged by water or dust. Hence, in the automotive sector, stringent requirements regarding a sealing are placed on a housing of a safety-related component For example, no material fatigue should result in a sealing material over the required product service life due to expansion changes occurring during temperature changes.

Conventionally, housing components are fixed using mechanical screws and elastic seals may be provided at joints. Normally with this approach, a housing seal with respect to surrounding influences and a fixing of the housing components are achieved. Conventionally, several technical and economic advantages may result by using flat instead of mechanical fixing elements such as, for example, when using an adhesive instead of a screw connection. German Patent Nos. DE 4340108 C2 and DE 29819434 U1 described that when joining housing components, an improved seal may be achieved if dosing lines situated adjacent to one another having different properties are used.

An object of the present invention is to avoid crack formation in a fixing element due to expansion changes resulting from changing temperatures or due to micromovements. In addition, the effect of a potential crack formation in the fixing element is to be minimized. The aim is to implement a fixing with a tight seal using a fixing element.

SUMMARY

The present invention relates to a device and to a method for the fixing of a joining partner using a fixing element and a compensating element. To achieve the aforementioned object, a substrate having a recess on the substrate surface is used. A joining partner protrudes at a submersion depth into the recess filled at least partially with a fixing element, the joining partner being fixed by a curing of the fixing element on the substrate. According to the present invention, a compensating element is situated between the joining partner and the fixing element. The compensating element is made, in particular, of an elastic sealing material. The compensating element is in contact with the joining partner and with the fixing element. In addition, it is situated at least partially in the fixing element within the submersion depth of the joining partner. The advantage of this arrangement is that a thermal expansion change or a mechanical movement of the fixing element, of the substrate or of the joining partner may be compensated for by an elastic compression or elongation of the compensating element. Such an approach may also reduce costs, because mechanical fixing elements are omitted, for example, and/or a simplification of the assembly process takes place.

Possible specific embodiments of the joining partner in the area of the submersion depth are, for example, a rounded edge, a tip or a rectangular shape. Thus, the joining partner has at least one surface in the area of the submersion depth into the recess.

Alternatively, the joining partner also has a first side and a second side, as well as possibly a bottom side in the area of the submersion depth. The compensating element may be situated at least partially on the surface of the joining partner or on the first side, on the second side and/or on the bottom side of the joining partner. The compensating element is advantageously situated where the greatest stress occurs within the fixing element in the fixed state. The stress is, in particular, a thermal expansion change or a movement of the fixing element, of the joining partner and/or of the substrate.

In one alternative embodiment, compensating elements may be situated according to the present invention at multiple points on the surface of the joining partner or on the first side, on the second side and/or on the bottom side. The fixing element is then situated between the compensating elements. With such an embodiment, a stress such as, for example, a volume change of the fixing element resulting from thermal expansion is distributed to multiple compensating elements, which minimizes the probability of a crack formation. Moreover, a potential defect in one compensating element may be compensated for by another compensating element and, thus, the seal is designed to be redundant and therefore to be more robust against contaminations, dosing errors and/or material flaws.

The compensating element is advantageously applied to the joining partner prior to the joining, because the compensating element may then be precisely positioned. To achieve a sealing of the joining partner and to avoid a shifting of the compensating element during the joining, an adhesion between the compensating element and the joining partner should be greater than the adhesion between the compensating element and the fixing element. The adhesion may be positively influenced by a suitable material selection of the joining partner and/or of the compensating element and/or by pre-treating or coating of the joining partner. The increased adhesion may also be achieved by thermal or chemical curing of the compensating element at least partially taking place prior to the joining.

One alternative specific embodiment is the application of the compensating element on the fixing element surface in the recess prior to the joining. The compensating element in this case may be applied partially or completely on the fixing element surface. This specific embodiment of the application may have a cost advantage because the manufacturing process may be simplified by a serial dosing in parallel of the fixing element and of the compensating element. The positioning according to the present invention of the compensating element between the fixing element and the joining partner during the application on the fixing element surface may be achieved by a suitable joining method. The positioning may be achieved by a high viscosity of the compensating element relative to the fixing element, by a good adhesion between the compensating element and the joining partner, by a rapid joining process, by a precisely positioned joining process and/or by a partial covering of the fixing element surface with the compensating element.

The recess on the substrate surface having a recess depth may also be shaped, for example, in cross section as a trapezoidal trench. This permits an automatic, form-locking fine centering during the joining process.

A good fixing of the joining partner to the substrate and a compensation of the stresses by the elasticity of the compensating element require minimum dimensions of the compensating element and of the fixing element in the recess, depending on the type and intensity of the stress. In one advantageous specific embodiment, at least two thirds of the recess are filled with the fixing element prior to the joining. The height of the fixing element in the recess above a bottom of the recess prior to the joining is referred to as the fixing element height. The submersion depth of the joining partner into the fixing element is advantageously at least sixty percent of the fixing element height. In addition, a compensation height in the fixing element is advantageously at least one fifth of the submersion depth. Moreover, in one refinement of the present invention, a compensating element width is one third the fixing element width in the area of the compensation height.

In addition, a joining height may be defined between a recess bottom and the fixed joining partner. In one advantageous specific embodiment, the fixing element is situated below the joining partner. With a resulting joining height, thermal expansions of the fixing element may be more centrally compensated for via an additional arrangement of the compensating element on a bottom side than in the case of an arrangement in the vicinity of the fixing element surface.

In one alternative specific embodiment, the recess bottom is used in the method during the joining as a mechanical stop for the positioning of the joining partner. Thus, the joining partner submerges to the level of the recess bottom. In order to achieve a good compensation for the mechanical and thermal stresses in this specific embodiment according to the present invention, the compensating element may, for example, be applied on two sides. In order to sufficiently stabilize the fixing in this specific embodiment, the recess may be designed deeper by increasing a recess depth and thus increasing the submersion depth of the joining partner into the fixing element.

The present invention may be applied for different geometries and for different purposes. A recess on the substrate surface may extend in the top view punctiformly, circularly, elliptically, linearly, rectangularly or trapezoidally, as well as in a free form. The present invention may be used, for example, both for fastening in a hole as well as in a linear-shaped recess. The recess may also include in the top view a substrate area on the surface of the substrate. In addition, the joining partner may also be designed in a variety of ways such as, for example, as a rod or metal sheet. If necessary, the joining partner also has an additional molding in the area of the submersion depth, i.e., in the area of the fixing.

If the recess encloses in the top view a substrate area on the surface and a joining partner shaped as a cap is present, then in one preferred embodiment of the present invention, the substrate, the fixing element, the compensating element and the joining partner may form a space separated from the surroundings. Thus, the substrate, the fixing element, the compensating element and the joining partner implement a housing, which may be utilized, for example, for protecting an electrical circuit or an electrical sensor against surrounding influences.

In one alternative characteristic of the method, the fixing element is chemically or thermally partially cured prior to the joining. This is advantageous if, for example, the curing time after the joining is to be reduced. By reducing the curing time after the joining, the device may be quickly further handled or packaged. Moreover, a thermal, partial curing prior to the joining may be necessary if, for example, integrated or attached components are temperature sensitive.

In one alternative, advantageous embodiment of the method, the fixing element and the compensating element are chemically or thermally cured together after the joining. One advantage of curing together may, for example, be a potential reduction of a thermal heating process and the costs associated with this.

DETAILED DESCRIPTION OF EXAMPLE EMBODIMENTS

Figure 1:
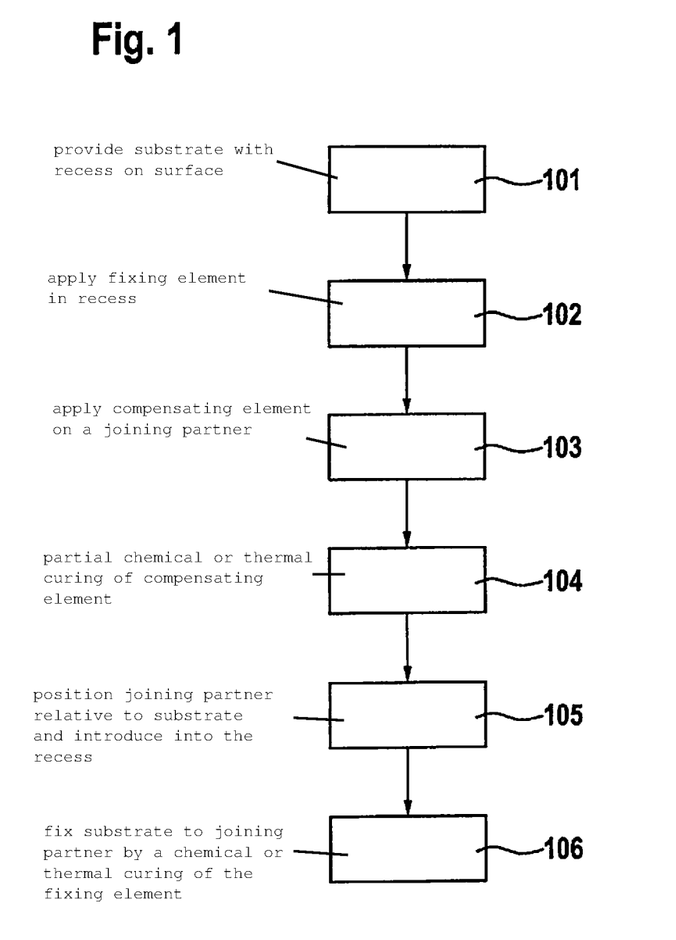
FIG. 1 shows a flow chart according to the present invention including the process steps of the method.
Figures 2A, 2B:
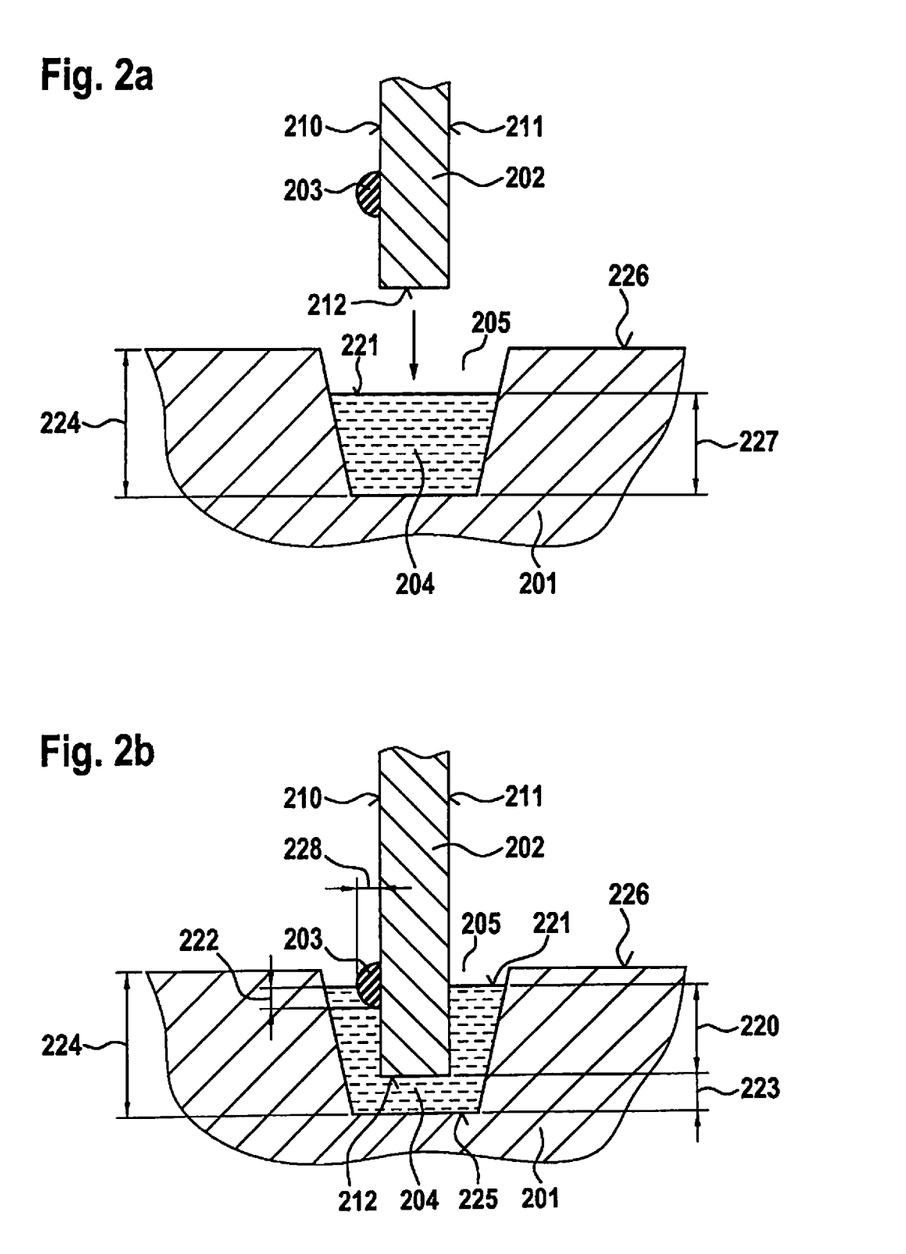
FIG. 2a shows the procedural principle of the joining in cross section for manufacturing a device according to the present invention.
FIG. 2b shows the device according to the present invention resulting according to FIG. 2a in a first exemplary embodiment after the joining.

FIG. 1 illustrates the method for manufacturing a device according to the present invention, as depicted in cross section in FIG. 2b. In a first method step 101, a substrate 201 is used having a recess 205 on substrate surface 226 and a recess depth 224. In a second step 102, a fixing element 204 is applied in recess 205. The fixing element in this case is, in particular, an adhesive. According to the present invention, a compensating element 203 is applied on a joining partner 202 in third method step 103. Compensating element 203 in this case includes, in particular, a sealing material. In a subsequent fourth method step 104, an at least partial chemical or thermal curing of the compensating element 203 is carried out. In fifth step 105, the joining depicted in FIG. 2a, joining partner 202 is positioned relative to substrate 201 and introduced at a submersion depth 220 into the recess filled with fixing element 204. Recess 205 has a trapezoidal cross section in FIG. 2a: this permits an automatic centering during joining 105. The vertical distance between joining partner 202 and a recess bottom 225 resulting after the joining in FIG. 2b is referred to as joining height 223. The complete envelopment of the joining partner by the fixing element in the recess achieved by joining height 223 permits a strong fixing of substrate 201 and joining partner 202 and a simple dosing process in terms of manufacturing technology. Compensation height 222 is defined as a distance within submersion depth 220, along which the compensating element is situated between joining partner 202 and fixing element 204. A fixing of substrate 201 to joining partner 202 by a chemical or thermal curing of fixing element 204 takes place as final method step 106.

The device according to the present invention from FIG. 2b manufactured according to the method depicted in FIG. 1 may, for example, be a fixing of a rod in a hole-shaped recess, a fixing of a straight, planar metal sheet in a linear-shaped recess or a fixing of a round cap in a circular recess for manufacturing a housing. With a device manufactured according to this method, it is possible to compensate for stresses such as, for example, thermal expansion changes of fixing element 204 or to seal micro-cracks potentially forming in fixing element 204.

Process steps 102 and 103 of the method depicted in FIG. 1, i.e., the application of fixing element 204 and the application of compensating element 203 may be chronologically switched or may proceed in parallel. This has manufacturing-related advantages, for example, for reducing cycle time.

As an alternative embodiment of the method depicted in FIG. 1, fourth step 104 for chemically or thermally curing compensating element 203 may take place together with sixth step 106 for chemically or thermally curing fixing element 204. In this way, lower manufacturing costs may be achieved, because a more expensive method step is eliminated and thus, the method as a whole may be shortened.

As another specific embodiment of the method depicted in FIG. 1, a chemical or thermal partial curing of fixing element 204 may take place prior to the joining. A chemical curing in this context means that, in particular, an adhesive is able to cross-link independently through chemical reaction and thereby cure. A partial curing of fixing element 204 prior to the joining may reduce or render unnecessary the chemical or thermal curing time after the joining in step 106. In this embodiment of the method, a component including a device according to the present invention may, for example, be quickly packaged after the joining for shipment.

Figure 3:
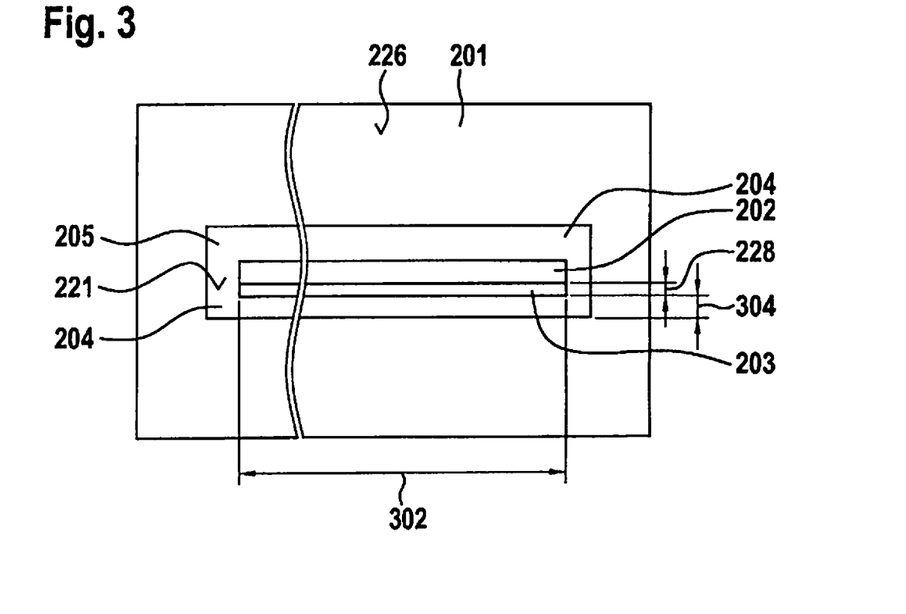
FIG. 3 shows the top view of the fixing depicted according to FIG. 2b in a planar, rectangular joining partner.

FIG. 3 shows the fixing in the case of a rectangular shaped joining partner 202 resulting according to FIG. 2b in a top view. A straight recess 205 filled with a fixing element 204 on a substrate 201 is apparent, a compensating element 203 being situated according to the present invention on a first side 210 of joining partner 202. It is advantageous for the compensation of the thermal and mechanical stresses and, in particular, for the sealing function, that the compensating element is situated completely over joining partner length 302, as depicted in FIG. 3. It is also apparent that compensating element width 228 is exactly as wide as fixing element width 304. Thus, a stress may be well compensated for by the compensating element if compensation height 222 is sufficiently great.

Alternatively, compensating element width 228 may be narrower or wider than fixing element width 304, a wide design with an arrangement according to the present invention and with sufficient compensation height 222 increasing the compensable stresses and the sealing function. Thus, in one advantageous design, compensating element width 228 is at least one third of fixing element width 304 and compensation height 222 in fixing element 204 is at least one fifth of submersion depth 220.

Figure 4:
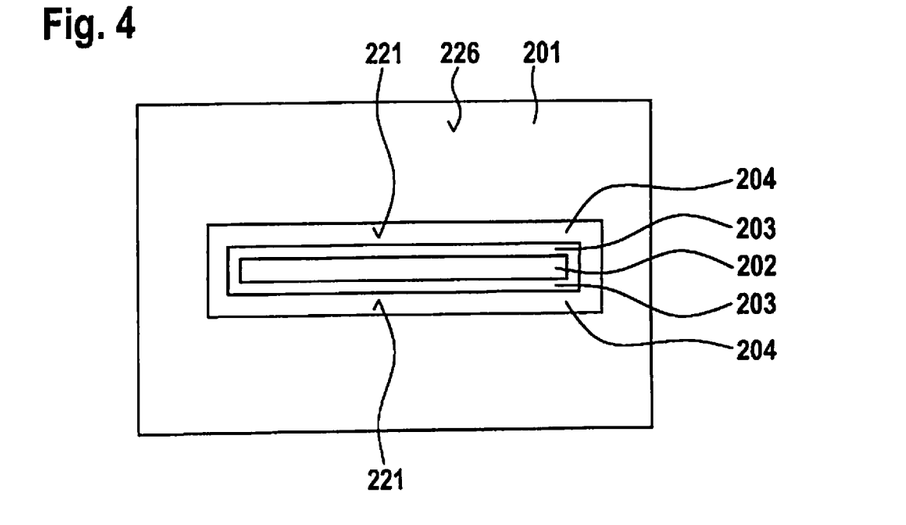
FIG. 4 shows as a second exemplary embodiment the fixing of a rectangular joining partner in a top view if in method step 103, the compensating element is fully applied on the surface of the fixing element and not, as depicted in FIG. 2a, on the joining partner.
Figure 5:
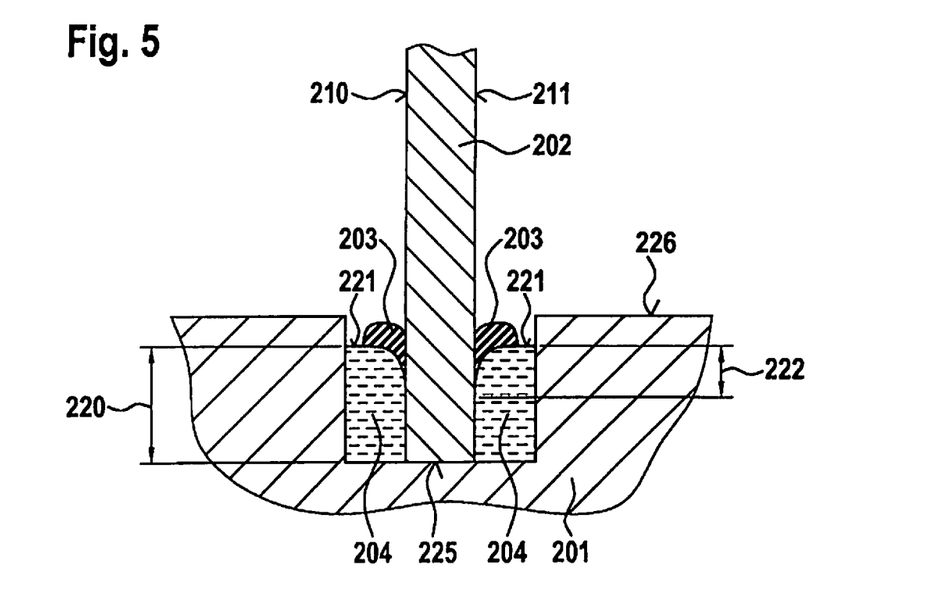
FIG. 5 shows the exemplary embodiment depicted in FIG. 4 in cross section.

In one alternative embodiment of the present invention, compensating element 203 is applied on fixing element surface 221 in process step 103. This embodiment generates a cost advantage, because the manufacturing process may be simplified by a serial dosing in parallel of fixing element 204 and of compensating element 203. As depicted in FIG. 4, compensating element 203 in one design variant may at least partially cover fixing element surface 221. This results in the advantage that an improved sealing function is achieved. This is depicted in FIG. 5 and in a device cross section consistent with FIG. 4. The arrangement of compensating element 203 on fixing element surface 221 is apparent.

Figure 6:
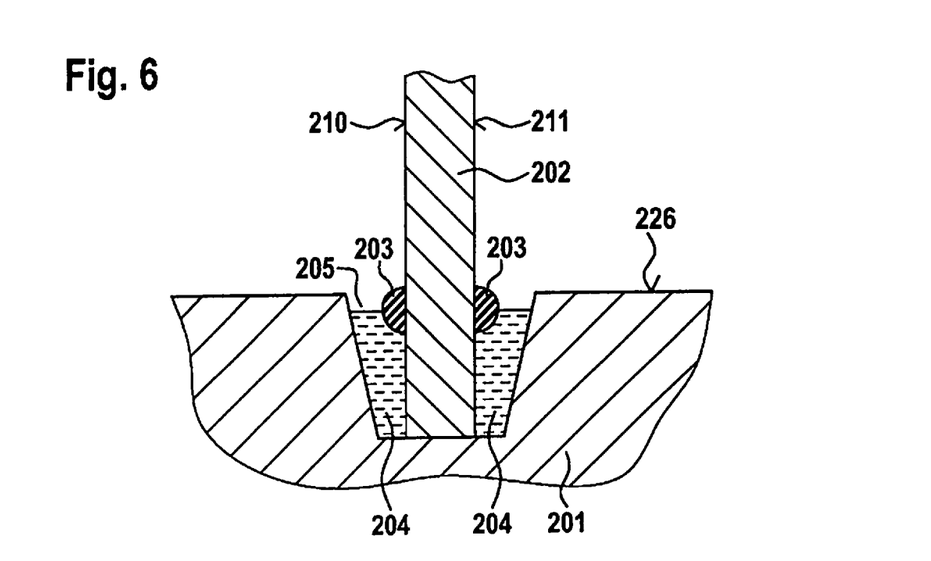
FIG. 6 shows a third exemplary embodiment of the device according to the present invention in cross section in a two-sided arrangement of the compensating element on the joining partner.

Another exemplary embodiment is apparent in cross section in FIG. 6. The joining partner submerges to recess bottom 225. The joining partner also has a rectangular shape in the area of submersion depth 220 and, therefore a first side 210 and a second side 211. Compensating element 203 is situated in two places and opposite one another on first side 210 and on second side 211 of joining partner 202. This has the advantage of an improved compensation of expansion changes and/or of mechanical movements. Moreover, the arrangement according to FIG. 6 implements an optimized sealing function.

Figure 7:
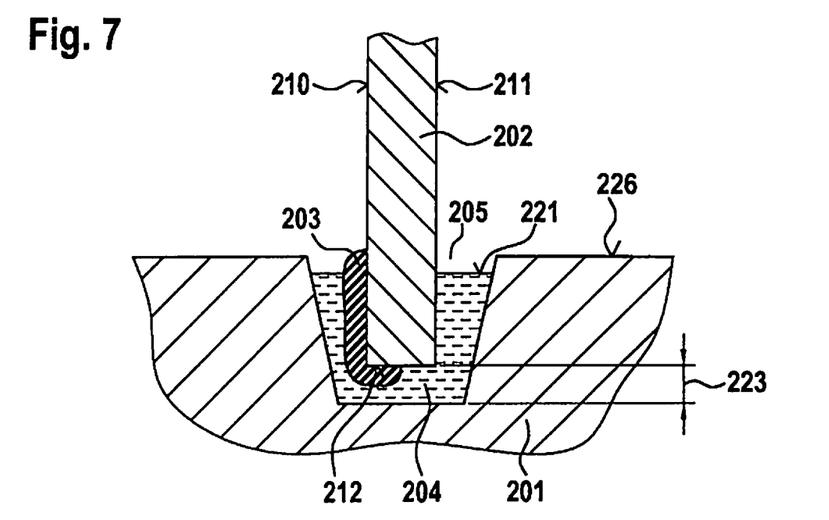
FIG. 7 shows a fourth exemplary embodiment of the device according to the present invention in cross section, the compensating element extending from the first side to the bottom side of the joining partner.

Another exemplary embodiment is apparent in cross section in FIG. 7. The joining partner has a rectangular shape in the area of submersion depth 220 and a joining height 223. Thus, it has a first side 210, a second side 211 and a bottom side 212. In this case, compensating element 203 extends from first side 210 to bottom side 212. This has the advantage over the example from FIG. 2b of an improved compensation of the stresses, i.e., of the expansion changes and of the mechanical movements.

Figure 8:
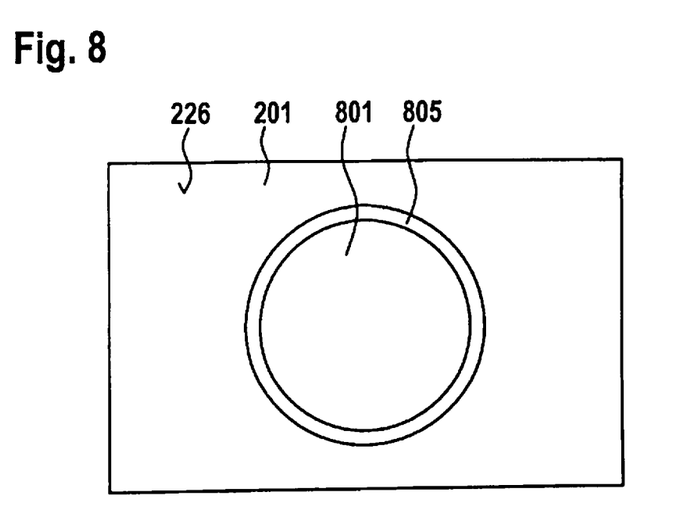
FIG. 8 shows an exemplary embodiment in a top view, the recess on the substrate enclosing a substrate area on a substrate surface.

FIG. 8 shows a substrate 201 in a top view having a circular recess 805 on substrate surface 226, a substrate area 801 being enclosed on substrate surface 226. Such a design of recess 205 is required in order, as depicted in FIG. 9, together with a joining partner in the shape of a cap, to implement a space separated from the surroundings.

Figure 9:
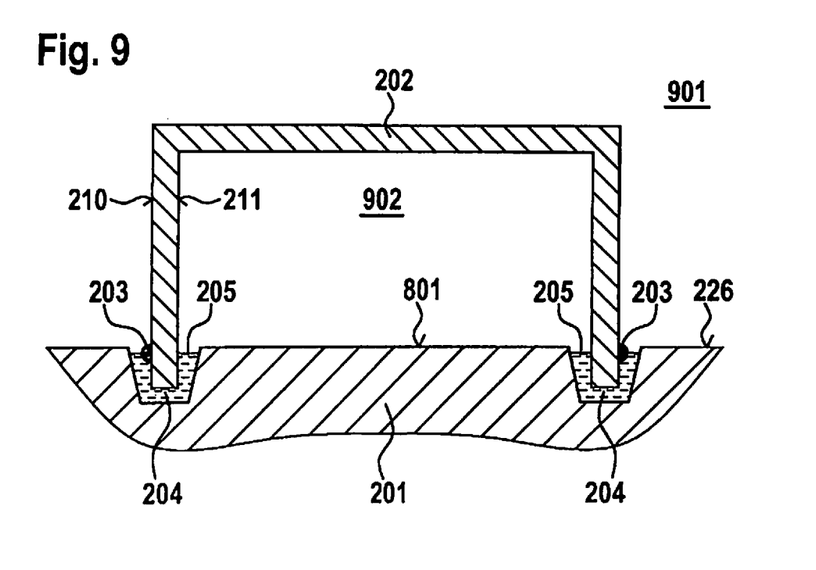
FIG. 9 shows an exemplary embodiment of the device according to the present invention in cross section for manufacturing a space separated from the surroundings with the aid of a joining partner shaped as a cap and a recess, which encloses a substrate area on a substrate surface on the substrate.

The exemplary embodiment in FIG. 9 shows a recess 205, 805 in cross section on substrate 201, recess 205, 805, as depicted in FIG. 8, circularly enclosing a substrate area 801 on a substrate surface 226. Joining partner 202 is also shaped as a cap. In this example, the device according to the present invention, as depicted similarly in FIG. 2b, is designed in such a way that the compensating element submerges on first side 210 into fixing element 204. Thus, as a result of the joining, substrate 201, joining partner 202, fixing element 204 and compensating element 203 form a space 902 closed off from surroundings 901. Compensating element 203 in this example seals space 902 off from the outside against influences of surroundings 901.

Electrical components, such as electrical circuits or sensors, for example, may be placed on the substrate and within the area enclosed by the recess. The electrical components are located in enclosed space 902 as a result of the joining. Hence, they are protected, for example, against water or dust.

If joining partner 202 shaped as a cap also includes, for example a flexible diaphragm for pressure equalization between surroundings 901 and space 902, then pressure sensors for the surroundings may also be used in space 902 and be protected against harmful influences from the surroundings.

Alternatively, recess 805 in FIG. 8 could also extend elliptically, quadratically, rectangularly, trapezoidally or in a free form. The joining partner must then also be designed accordingly in order to implement a separated space.

Figure 10:
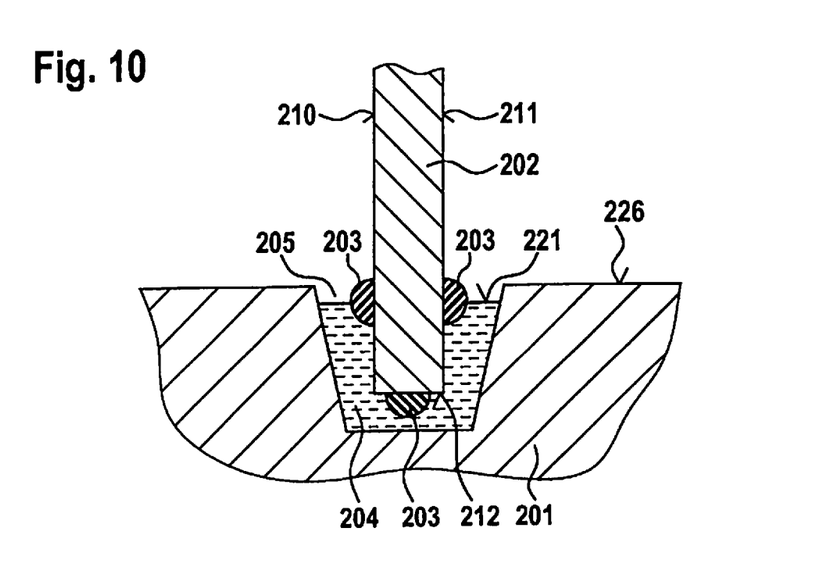
FIG. 10 shows an exemplary embodiment of the device according to the present invention in cross section with multiple arrangement of the compensating element on the joining partner.

The device according to the present invention from FIG. 10 has three compensating elements on the surfaces of joining partner 202, respectively one compensating element each on first side 210, on second side 211 and on bottom side 212. Compensating elements 203 in this case are situated according to the present invention. Fixing element 204 is located between compensating elements 203. In this way, it is possible to further minimize crack formation and to redundantly design the seal.

Figure 11:
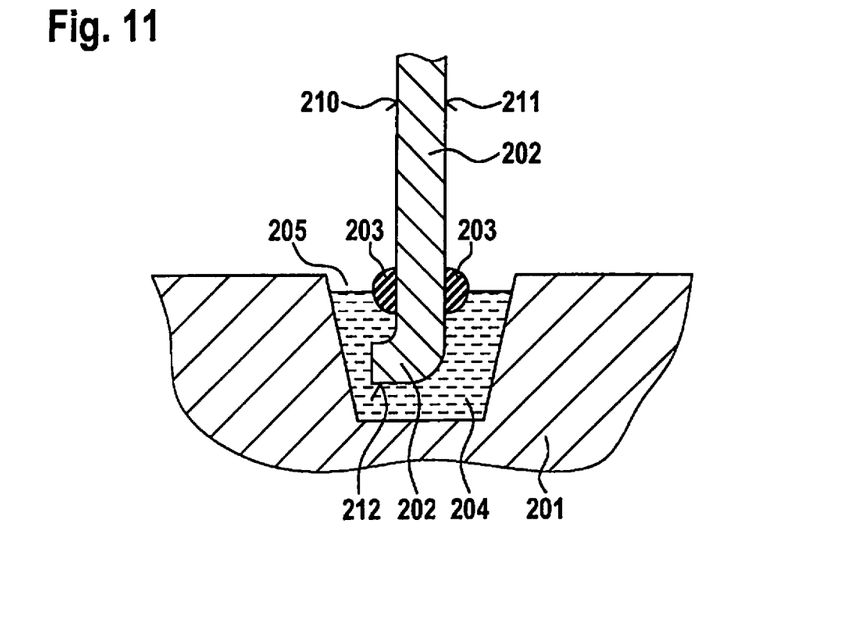
FIG. 11 shows an exemplary embodiment of the device according to the present invention in cross section with multiple arrangement of the compensating element on the joining partner.
Figure 12:
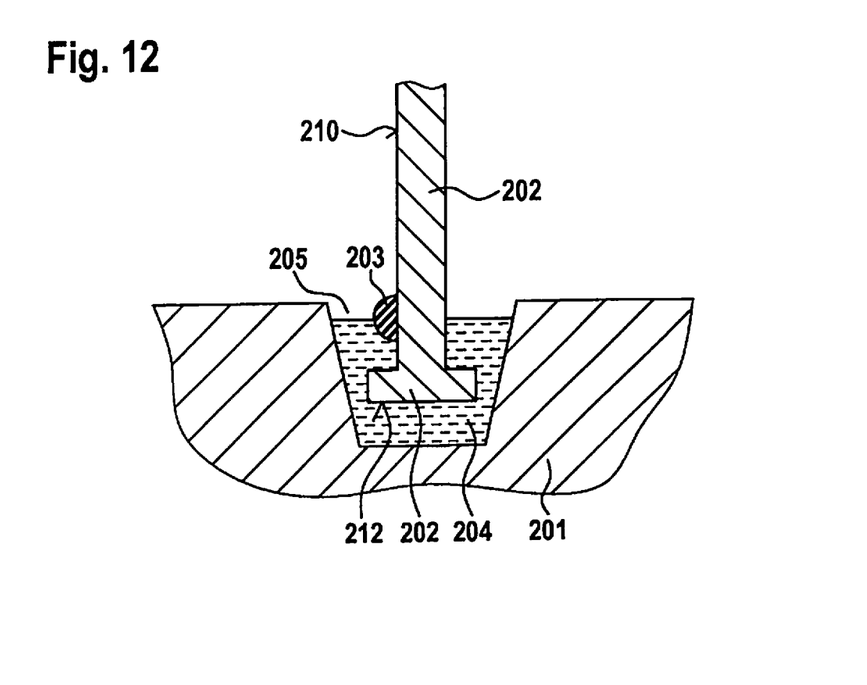
FIG. 12 shows an exemplary embodiment of the device according to the present invention in cross section with multiple arrangement of the compensating element on the joining partner.

According to the present invention, joining partner 202 may have a one-sided molding on first side 210 or on second side 211 at the end submerging into fixing element 204. A one-sided molding on first side 210 of joining partner 202 is depicted, for example, in FIG. 11. Alternatively, joining partner 202 may have a two-sided molding on first side 210 and on second side 211 at the end submerging into fixing element 204, as depicted in FIG. 12. Compensating element 203 may, as described in the preceding exemplary embodiments, be situated on first side 210 on second side 211 and/or on bottom side 212. Moldings of joining partner 202 at the end submerging into fixing element 204, as depicted in FIG. 11 and in FIG. 12, permit a reinforcement of the fixing by fixing element 204 and/or a reduction of the shear forces on compensating element 203 applied to joining partner 202 during submerging of joining partner 202 into fixing element 204.

Figure 13:
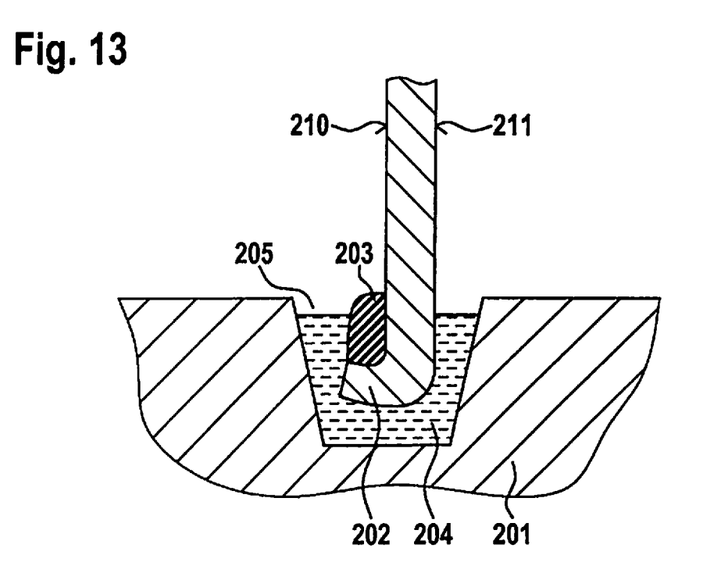
FIG. 13 shows an exemplary embodiment of the device according to the present invention in cross section with multiple arrangement of the compensating element on the joining partner.

If, as depicted in FIG. 13, compensating element 203 is situated on the end submerging into fixing element 204 on the same side as a molding of joining partner 202 and in contact with the molding, shear forces on compensating element 203 and a potential formation of air pockets inside fixing element 204 may be avoided or reduced during submerging of the joining partner into the fixing element.

What is claimed is:

1. A device for fixing a joining partner, comprising:
    a substrate;
    a joining partner; and
    a fixing element, the fixing element being an adhesive, the substrate having a recess on the substrate surface filled at least partially with the fixing element, and the joining partner protruding into the fixing element at an submersion depth, the joining partner being fixed by the fixing element;
    wherein a compensating element made of an elastic sealing material is situated between the joining partner and the fixing element, is in contact with the joining partner and with the fixing element and is at least partially in the fixing element within the submersion depth of the joining partner, a thermal expansion change or a mechanical movement of the fixing element, of the substrate, or of the joining partner being compensated for by an elastic compression or elongation of the compensating element;
    wherein the joining partner is shaped as a cap, and wherein the substrate, the joining partner shaped as the cap, the compensating element and the fixing element, together form a space separated from surroundings, the substrate having a substrate area on the substrate surface enclosed by the recess; and
    wherein an electronic component is situated within the substrate area on the substrate surface enclosed by the recess.

2. The device as recited in claim 1, wherein the compensating element is situated on at least one of: (i) a surface of the joining partner, (ii) a first side of the joining partner, (iii) a second side of the joining partner, and or (iv) a bottom side of the joining partner.

3. The device as recited in claim 1, wherein an adhesion between the compensating element and the joining partner is greater than an adhesion between the compensating element and the fixing element.

4. The device as recited in claim 1, wherein a compensating element width is at least one fourth of a fixing element width.

5. The device as recited in claim 1, wherein an arrangement of the compensating element within the submersion depth has a compensation height in the fixing element and the compensation height is at least one tenth of the submersion depth.

* * * * *